United States Patent
Amano

(10) Patent No.: US 9,981,871 B2
(45) Date of Patent: May 29, 2018

(54) FABRICATING HIGHLY DURABLE NANOSTRUCTURED COATINGS ON POLYMER SUBSTRATE

(71) Applicant: Konica Minolta Laboratory U.S.A., Inc., San Mateo, CA (US)

(72) Inventor: Jun Amano, Hillsborough, CA (US)

(73) Assignee: Konica Minolta Laboratory U.S.A., Inc., San Mateo, CA (US)

( * ) Notice: Subject to any disclaimer, the term of this patent is extended or adjusted under 35 U.S.C. 154(b) by 0 days. days.

(21) Appl. No.: 14/912,406

(22) PCT Filed: Aug. 29, 2014

(86) PCT No.: PCT/US2014/053541
§ 371 (c)(1),
(2) Date: Feb. 17, 2016

(87) PCT Pub. No.: WO2015/031831
PCT Pub. Date: Mar. 5, 2015

(65) Prior Publication Data
US 2016/0200630 A1    Jul. 14, 2016

Related U.S. Application Data

(60) Provisional application No. 61/871,735, filed on Aug. 29, 2013.

(51) Int. Cl.
C03C 23/00    (2006.01)
B05D 3/00    (2006.01)
(Continued)

(52) U.S. Cl.
CPC ............ *C03C 11/005* (2013.01); *B05D 3/007* (2013.01); *B05D 3/06* (2013.01); *B05D 5/00* (2013.01);
(Continued)

(58) Field of Classification Search
None
See application file for complete search history.

(56) References Cited

U.S. PATENT DOCUMENTS 4,066,336 A * 1/1978 Zeller .................. G02F 1/1525
                                                            359/270
4,095,876 A    6/1978 Horsting et al.
(Continued)

OTHER PUBLICATIONS

International Search Report issued in application No. PCT/US14/53541 dated Nov. 24, 2014 (1 page).
(Continued)

*Primary Examiner* — Shamim Ahmed
(74) *Attorney, Agent, or Firm* — Osha Liang LLP

(57) ABSTRACT

A method of forming a coating that includes depositing a multicomponent glass layer on a polymer substrate and depositing a heat absorbing layer on the multicomponent glass layer. Inducing spinodal decomposition of the multicomponent glass layer by annealing the heat absorbing layer, and etching at least one of a phase separated component of the multicomponent glass layer. The spinodal decomposition may be achieved through a pulse thermal or electromagnetic assisted annealing process. The coating may then be used as a hydrophilic surface, or may be fluorinated using conventional methods to produce the superhydrophobic coating.

11 Claims, 3 Drawing Sheets

(51) Int. Cl.
    *C03C 11/00*     (2006.01)
    *B05D 3/06*     (2006.01)
    *B05D 5/00*     (2006.01)
    *B05D 7/02*     (2006.01)
    *C03C 15/00*     (2006.01)
    *C23C 14/34*     (2006.01)
    *C23C 18/38*     (2006.01)
    *C23C 14/10*     (2006.01)
    *C23C 14/18*     (2006.01)

(52) U.S. Cl.
    CPC ............... *B05D 7/02* (2013.01); *C03C 15/00* (2013.01); *C03C 23/0005* (2013.01); *C23C 14/34* (2013.01); *C23C 18/38* (2013.01); *C23C 14/10* (2013.01); *C23C 14/185* (2013.01)

(56) References Cited

U.S. PATENT DOCUMENTS

| | | | |
|---|---|---|---|
| 4,097,258 A | 6/1978 | Horikawa et al. | |
| 4,243,299 A | 1/1981 | Gliemeroth et al. | |
| 5,618,325 A | 4/1997 | Baniel | |
| 6,048,621 A | 4/2000 | Gallego et al. | |
| 6,478,932 B1 | 11/2002 | Chu et al. | |
| 7,258,731 B2 | 8/2007 | D'Urso et al. | |
| 8,241,508 B2 | 8/2012 | D'Urso et al. | |
| 2004/0105980 A1 | 6/2004 | Sudarshan et al. | |
| 2007/0009657 A1 | 1/2007 | Zhang et al. | |
| 2007/0184247 A1 | 8/2007 | Simpson et al. | |
| 2009/0128908 A1* | 5/2009 | Nakazawa | G02B 5/3058 359/489.08 |
| 2009/0289301 A1 | 11/2009 | Shieh et al. | |
| 2010/0015244 A1* | 1/2010 | Jain | A61L 27/56 424/602 |
| 2012/0088066 A1 | 4/2012 | Aytug et al. | |

OTHER PUBLICATIONS

Written Opinion issued in application No. PCT/US14/53541 dated Nov. 24, 2014 (7 pages).

Tak-Sing Wong, et al.; "Interfacial materials with special wettability"; MRS Bulletin; vol. 38; May 2013; pp. 366-371 (6 pages).

Tolga Aytug, et al.; "Optically transparent, mechanically durable, nanostructured superhydrophobic surfaces enabled by spinodally phase-separated glass thin films"; IOP Publishing Ltd; Nanotechnology 24 (2013) 315602 (8 pages).

Masanori Suzuki et al.; "Prediction of phase separation in multi-component oxide glass for the fabrication of porous glass materials from waste slag"; International Conference on Advanced Structural and Functional Materials Design 2008; IOP Publishing; Journal of Physics: Conference Series 165 (2009) 012078 (4 pages).

* cited by examiner

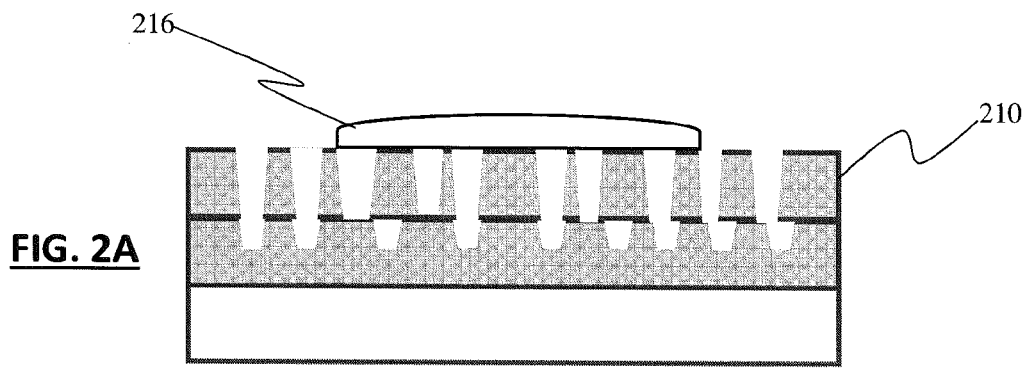
FIG. 2A
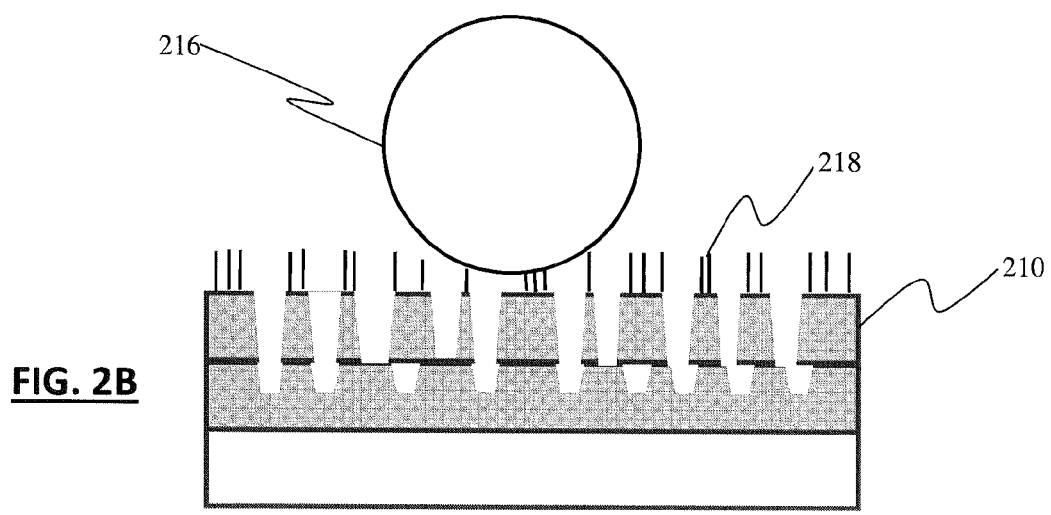
FIG. 2B
FIG. 2

FABRICATING HIGHLY DURABLE NANOSTRUCTURED COATINGS ON POLYMER SUBSTRATE

BACKGROUND

A nanostructured coating is a nanoscopic layer that can be applied to any surface. Currently, most nanostructured layers are formed by depositing nanoparticles on the surface. However, due to the nature of additive nanostructures in conventional coatings, durability of the coating is generally low. The currently available highly durable coatings are only suitable for glass substrates due to the high process temperatures necessary for formation. Typical polymer substrates such as Polyethylene terephthalate (PET) and Polyethylene naphthalate (PEN) degrade around 150° C. Currently, there are no simple technological solutions to fabricate highly durable nanostructured coatings on polymer substrates.

SUMMARY OF INVENTION

In general, in one aspect, the invention relates to a method for producing highly durable coatings on polymer substrates using low process temperature. The method includes depositing a multicomponent glass layer on a polymer substrate and depositing a heat absorbing layer on the multicomponent glass layer. Inducing spinodal decomposition of the multicomponent glass layer by annealing the heat absorbing layer and etching at least one of a phase separated component of the multicomponent glass layer. The spinodal decomposition may be achieved through a pulse thermal or electromagnetic assisted annealing process. The coating may then be used as a hydrophilic surface, or may be fluorinated using conventional methods to produce the superhydrophobic coating.

In general, in one aspect, the invention relates to a system for generating a coating using a multicomponent glass layer deposited on a polymer substrate that includes a heat absorbing layer for deposition on the multicomponent glass layer. An electromagnetic source is configured to anneal the heat absorbing layer and induce spinodal decomposition of the multicomponent glass layer. An acid is configured to etch at least one of a phase separated component of the multicomponent glass layer. The spinodal decomposition may be achieved through a pulse thermal or electromagnetic assisted annealing process. The coating may then be used as a hydrophilic surface, or may be fluorinated using conventional methods to produce the superhydrophobic coating.

Other aspects of the invention will be apparent from the following description and the appended claims.

BRIEF DESCRIPTION OF DRAWINGS

FIGS. 2A and 2B show schematics in accordance with one or more embodiments of the invention.

DETAILED DESCRIPTION

Figure 1:
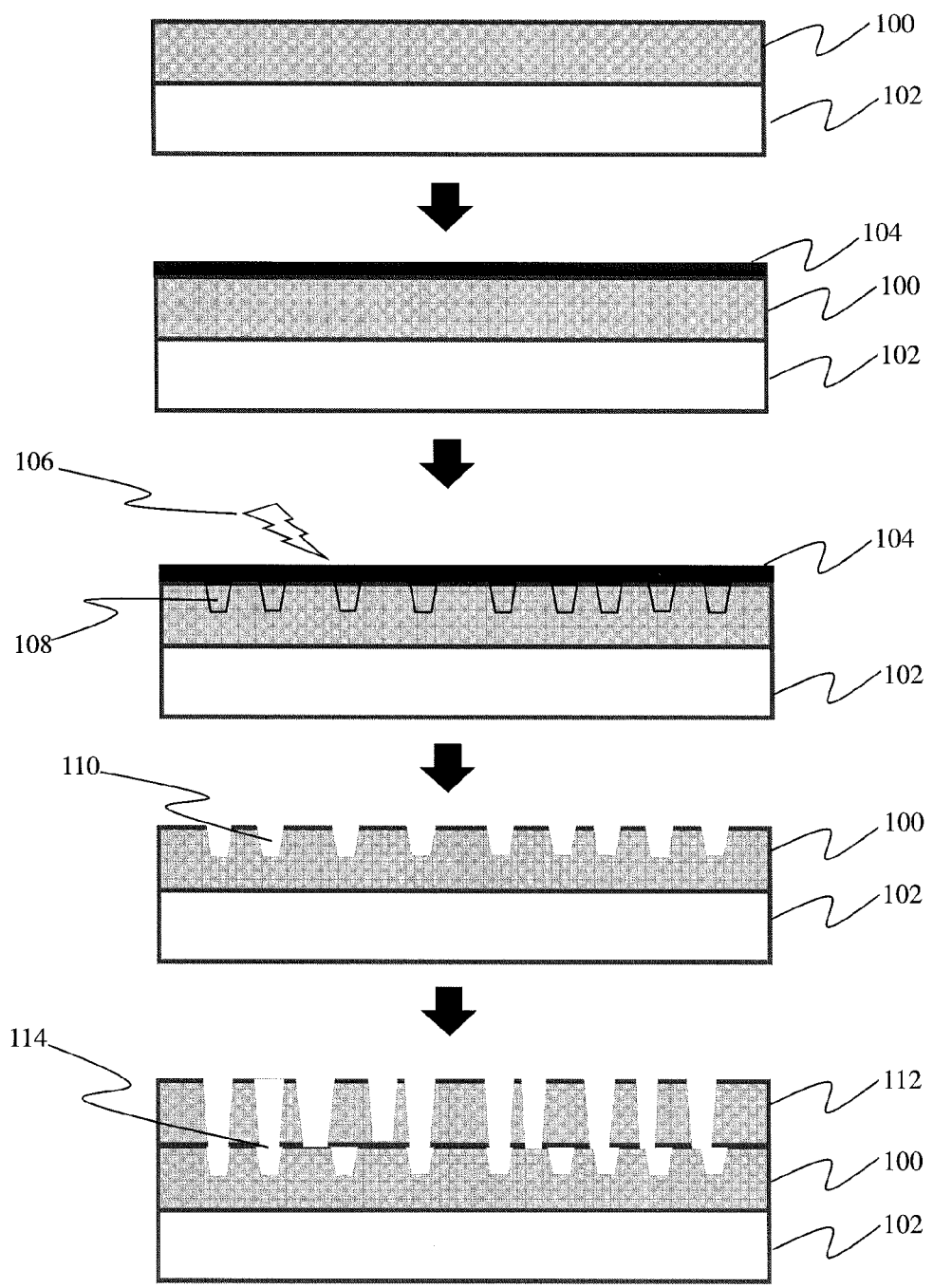
FIG. 1 shows a schematic in accordance with one or more embodiments of the invention.

Specific embodiments of the invention will now be described in detail with reference to the accompanying figures. Like elements in the various figures are denoted by like reference numerals for consistency. Further, the use of "Fig." in the drawings is equivalent to the use of the term "Figure" in the description.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the invention relate to a method and system for producing highly durable coatings on polymer substrates using a low process temperature.

Embodiments of the claimed invention include one or more room temperature deposited multicomponent glass layers on a polymer substrate. The multicomponent glass layer is phase-separated by spinodal decomposition using a pulse thermal or UV assisted annealing process. Selective chemical etching of a certain phase-separated components of the multicomponent glass layer forms a nanostructured surface. In one or more embodiments, the process is repeated until the desired thickness of the etched multicomponent glass layer is achieved. The nanostructured surface may then be used as a hydrophilic surface, or may be fluorinated using conventional methods to produce the superhydrophobic coating. In one or more embodiments of the invention, the polymer substrate is maintained at or below a certain low temperature for integrality.

FIG. 1 is a schematic in accordance with one or more embodiments of the invention. In FIG. 1, a multicomponent glass layer (100) with a desired thickness from a few hundreds nanometers to a few μm is deposited on common polymer substrate (102). Examples of the polymer substrate include, but are not limited to, Polyethylene terephthalate (PET) and Polyethylene naphthalate (PEN). The multicomponent glass layer (100) may be deposited by vacuum deposition, such as sputtering, or wet coating process, such as spin-on-glass. Examples of multicomponent glass include, but are not limited to, Pyrex (Corning 7740) (mol %): 81% $SiO_2$, 13% $B_2O_3$, 2% $Al_2O_3$, 4% $Na_2O$ and Corning 7070 (mol %): 71% $SiO_2$, 26% $B_2O_3$, 1% $Al_2O_3$, 0.5% $Na_2O$, 0.5% $Li_2O$, 0.5% $K_2O$.

A thin heat absorbing layer (104) from a few tens of nanometers to a few hundreds of nanometers is deposited on the top of the a multicomponent glass layer (100) in order to achieve high local surface temperature. The heat absorbing layer (104) may include a metal or alloy with a melting temperature around 1000° C. with good heat absorbing characteristics relative to a rapid pulse thermal or electromagnetic (UV/Vis/IR) process to be applied. Examples of the heat absorbing layer include, but are not limited to, copper, gold, silver, nickel, and mixtures or alloys thereof. The heat absorbing layer may be deposited using vacuum deposition, such as sputtering, or wet coating process, such as electroless plating. The heat absorbing layer (104) may be selected in conjunction with the electromagnetic (UV/Vis/IR) process to be applied.

In accordance with one or more embodiments of the invention, the inherent absorption of the material may be exploited to facilitate the absorption of the electromagnetic radiation and, thus, generate the heat necessary for spinodal decomposition. For example, gold and silver are known to absorb light in visible regions of the spectrum, while copper and nickel are known to absorb light in the ultraviolet regions of the spectrum. Further, such absorptions may also be influenced by the geometry of the heat absorbing layer (104) (i.e., thickness, presence of grain boundaries, etc.) as well as the conditions of the application of the electromagnetic (UV/Vis/IR) process (i.e., beam characteristics, pulse duration, angle of incidence, etc.).

In accordance with one or more embodiments of the invention, a rapid pulse thermal or electromagnetic (UV/Vis/IR) process is used to rapidly heat the heat absorbing layer (104) to anneal the multicomponent glass layer (100). The multicomponent glass layer (100) is annealed using a temperature from 600° C. to 750° C. at the multicomponent glass layer (100) to induce spinodal decomposition of the multicomponent glass layer. Spinodal decomposition is a mechanism for the rapid unmixing of a mixture of liquids or solids from one thermodynamic phase to form coexisting phases. The polymer substrate is maintained at low temperature (below 150° C.) due to the short duration plus-heating and the small thermal volume of the heat absorbing layer. The degree of the phase separation may be controlled by pulse power and duration.

In one or more embodiments of the invention, certain components (108) in the multicomponent glass layer (100) will be phase-separated by annealing at certain temperatures by spinodal decomposition. These certain phase separated components (108) of the multicomponent glass layer (100) will be selectively etched by acids due to large differences in etching characteristics from the mixtures.

One of ordinary skill in the art will appreciate that the material and thickness of the multicomponent glass layer (100), the material and thickness of the heat absorbing layer (104), and the selection of the rapid pulse thermal or electromagnetic (UV/Vis/IR) process are selected in conjunction to achieve the desired surface.

The heat absorbing layer (104) may be removed by either a dry (sputter-etching) or a wet (chemical etching) process in accordance with one or more embodiments of the invention. In addition, or concurrently, a certain phase separated component (108) of the multicomponent glass layer (100) may be etched by chemical etching using acids to form nanostructured surface (110). By controlling the degree of the phase separation induced by the heat absorbing layer (104) and the rapid pulse thermal or electromagnetic process, the desired nanostructure size and density may be obtained.

In one or more embodiments of the invention, the above process may be repeated as necessary to form addition nanostructured surface layers (112). In these embodiments, the size and density of nanostructures at the each layer may be controlled by changing heating power and duration in order to obtain the desired nanostructures indicating very flexible nature of this method.

In one or more embodiments of the invention, the annealing temperature and duration may include higher temperatures and/or longer durations to obtain a higher density and larger nanostructures. As a result, some nanostructures (114) may be connected vertically after the chemical etching.

FIG. 2 shows schematics in accordance with one or more embodiments of the invention. In general, as shown in FIG. 2A, the processed nanostructure surfaces (210) may exhibit hyrophilic properties, i.e., wettable by water (216). Therefore, if desired, the as processed nanostructure surfaces (210) may be used as hyrophilic surface.

In one or more embodiments of the invention, as shown in FIG. 2B, the surfaces of the nanostructured layer (210) are fluorinated (218) using conventional chemical treatments to make surface superhydrophobic, i.e., repel water (216). The fluorination allows the surface to reach a superhydrophobic level of water repulsion, e.g., a water contact angle of more than 150 degrees.

Although not shown in FIG. 2B, the side and bottom walls of the nanostructure coating may be also florinated. When the nanostrutures are connected as shown in FIG. 1 (114), the entire surfaces of the deeper nanostructures are expected to be flourinated.

In one or more embodiments of the invention, the durability of the superhydrophobic nanostructure coating is tested by common high pressure rubbing test or sand blasting test. Even after the surface of the coating is eroded during durability tests or exposure to real-world hash environments, the nanostructured coating may maintain superhydrophobic property due to abundant supply of fluorinated subsurface in the nanostructure coating.

Figure 3:
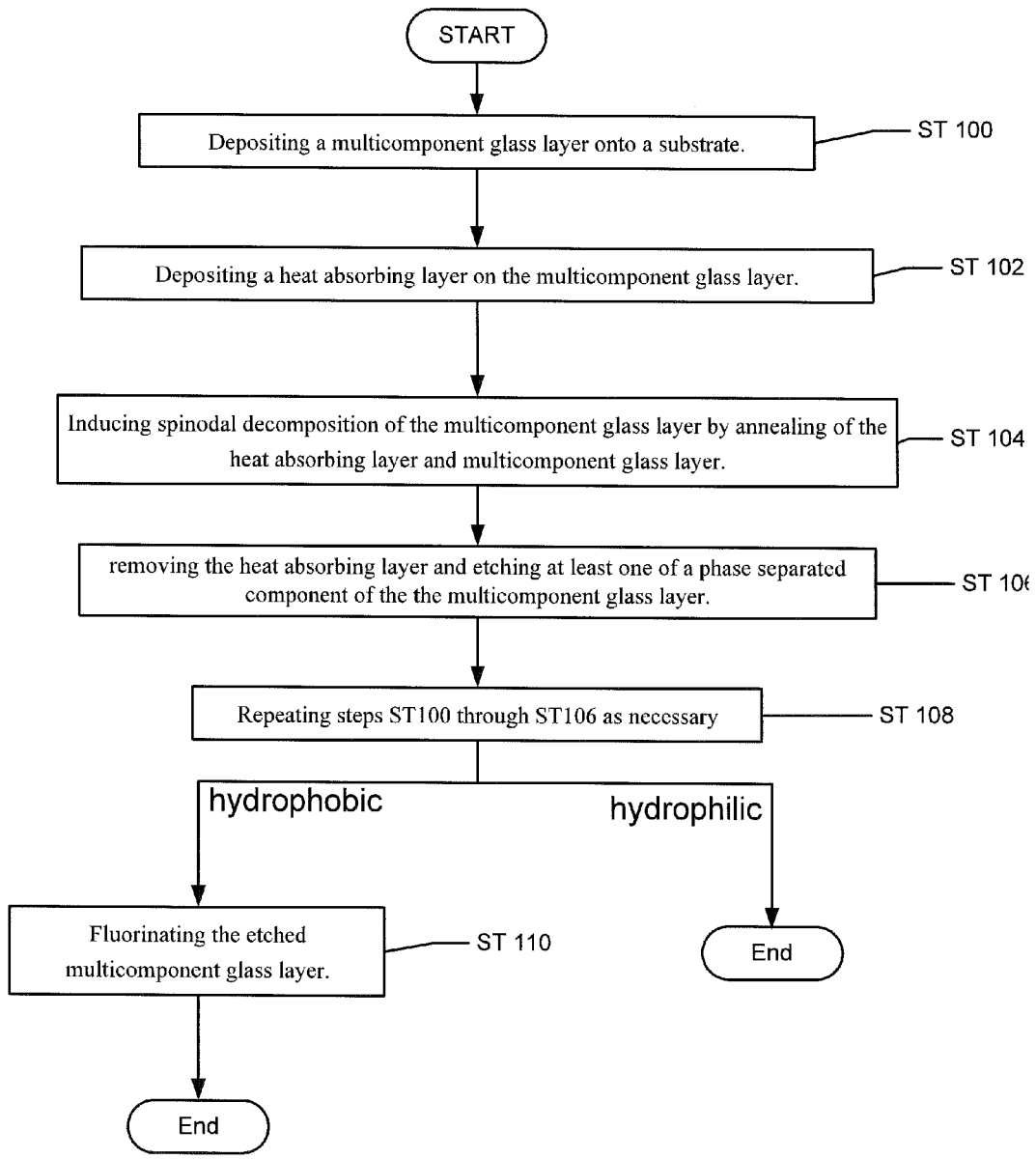
FIG. 3 shows a flowchart in accordance with one or more embodiments of the invention.

FIG. 3 is a flowchart in accordance with one or more embodiments of the invention. In ST 100, a multicomponent glass layer with a desired thickness from a few hundreds nanometers to a few μm is deposited on a polymer substrate by vacuum deposition.

In ST 102, a heat absorbing layer is deposited on the multicomponent glass layer. The heat absorbing layer may be from a few tens nanometers to a few hundreds nanometers thick. The heat absorbing layer may include a metal with an absorption at or near the applied electromagnetic radiation to induce annealing in the multicomponent glass layer.

In ST 104, spinodal decomposition of the multicomponent glass layer is induced by annealing the heat absorbing layer and multicomponent glass layer. The absorbing layer and multicomponent glass layer is annealed through the application of a rapid pulse thermal or electromagnetic (UV/Vis/IR) process that rapidly heats the heat absorbing layer, which consequently causes a phase separation of components in the multicomponent glass layer. In accordance with one or more embodiments of the invention, the polymer substrate may be maintained at a low temperature (e.g., below 150° C.).

In ST 106, the heat absorbing layer and at least one of a phase separated component of the multicomponent glass layer is removed to form a nanostructured surface layers. This may be achieve through the use of sputter etching or chemical etching. The heat absorbing layer and the at least one of a phase separated component of the multicomponent glass layer may be removed by etching in one or multiple etching steps.

In accordance with one or more embodiments of the invention, ST 108 is the repetition of ST 100 to ST 106 to form addition nanostructured surface layers. In these embodiments, the size and density of nanostructures at the each layer may be controlled by changing heating power and duration in order to obtain the desired nanostructures.

In accordance with one or more embodiments of the invention, if a hydrophilic surface is desired, the resultant nanostructured surface layer at the conclusion of ST 108 may be used.

In accordance with one or more embodiments of the invention, if a hydrophobic surface is desired, in ST 110 the etched multicomponent glass layer, or nanostructured surface layer, is fluorinated.

Advantageously, embodiments of the invention may provide a highly durable superhydrophobic coating on polymer substrates while maintaining low substrate temperature to avoid damaging integrity of the substrate. Embodiments may provide a highly durable coatings as compared to other superhydrophobic coatings. Nanostructures and coating thickness are easily controlled by repeating the same process multiple times in accordance with one or more embodiments of the invention. Embodiments may provide a surface with either hydrophobic or hydrophilic properties. Embodiments may be flexible and conformable to almost any structures. The methods described herein may be fabricated by roll-to-roll process.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method of forming a coating, comprising:
   depositing a multicomponent glass layer directly on a polymer substrate that degrades at a temperature of 150° C.;
   depositing a heat absorbing layer directly on the multicomponent glass layer;
   inducing spinodal decomposition of the multicomponent glass layer by annealing the heat absorbing layer; and
   etching at least one of a phase separated component of the multicomponent glass layer.

2. The method according to claim 1, further comprising: fluorinating, after etching, the multicomponent glass layer.

3. The method according to claim 1, wherein the multicomponent glass layer thickness is between 100 nm and 5 microns.

4. The method according to claim 1, wherein the multicomponent glass layer is deposited using sputtering.

5. The method according to claim 1, wherein the multicomponent glass layer is deposited using wet coating process.

6. The method according to claim 1, wherein the heat absorbing layer thickness is between 10 nm and 500 nm.

7. The method according to claim 1, wherein the heat absorbing layer is copper.

8. The method according to claim 1, wherein annealing of the heat absorbing layer is achieved by a rapid thermal pulse.

9. The method according to claim 1, wherein annealing of the heat absorbing layer is achieved by the application of electromagnetic radiation.

10. The method according to claim 1, wherein annealing of the heat absorbing layer heats the multicomponent glass layer to 600° C. to 750° C.

11. The method of claim 1, wherein the polymer substrate is maintained at a temperature less than 150° C.

* * * * *